(12) United States Patent
Bhatt et al.

(10) Patent No.: US 6,426,565 B1
(45) Date of Patent: Jul. 30, 2002

(54) ELECTRONIC PACKAGE AND METHOD OF MAKING SAME

(75) Inventors: Ashwinkumar C. Bhatt, Endicott; Paul E. Logan, Endwell; Amarjit S. Rai, Vestal, all of NY (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 09/533,402

(22) Filed: Mar. 22, 2000

(51) Int. Cl.[7] .................. H01L 23/43; H01L 23/52; H01L 29/40
(52) U.S. Cl. .................. 257/783; 257/731; 438/119
(58) Field of Search .................. 257/783, 782, 257/731; 438/119

(56) References Cited

U.S. PATENT DOCUMENTS

| | | | |
|---|---|---|---|
| 4,857,989 A | * 8/1989 | Mori et al. | |
| 4,926,240 A | * 5/1990 | Regione | |
| 5,070,596 A | 12/1991 | Gaul et al. | ............. 29/620 |
| 5,091,770 A | * 2/1992 | Yamaguchi et al. | |
| 5,185,550 A | 2/1993 | Morita et al. | ............. 310/344 |
| 5,218,234 A | 6/1993 | Thompson et al. | ......... 257/787 |
| 5,239,131 A | 8/1993 | Hoffman et al. | .......... 174/52.4 |
| 5,369,059 A | 11/1994 | Eberlein | ............. 437/213 |
| 5,530,278 A | 6/1996 | Jedicka et al. | ............. 257/432 |
| 5,557,150 A | 9/1996 | Variot et al. | ............. 257/787 |
| 5,558,267 A | 9/1996 | Humphrey et al. | ......... 228/4.5 |
| 5,723,899 A | 3/1998 | Shin | ............. 257/666 |
| 5,747,874 A | * 5/1998 | Seki et al. | |
| 5,767,447 A | 6/1998 | Dudderar et al. | ......... 174/52.4 |
| 5,798,909 A | 8/1998 | Bhatt et al. | ............. 361/764 |
| 5,808,873 A | 9/1998 | Celaya et al. | ............. 361/760 |
| 5,818,103 A | 10/1998 | Harada | ............. 257/676 |
| 5,885,852 A | 3/1999 | Kishikawa et al. | ......... 458/117 |

\* cited by examiner

Primary Examiner—Sheila V. Clark
(74) Attorney, Agent, or Firm—Lawrence R. Fraley

(57) ABSTRACT

An electronic package and method of making the electronic package is provided. An opening in the substrate of the electronic package is formed to substantially prevent adhesive which can bleed from under an electronic device from contacting conductive pads on the substrate. An electrical coupling is formed between the package's electronic device and conductive pads.

39 Claims, 4 Drawing Sheets

ELECTRONIC PACKAGE AND METHOD OF MAKING SAME

TECHNICAL FIELD OF THE INVENTION

This invention relates to an electronic package for use in packaging semiconductors, and more particularly to such packages wherein an electronic device (e.g. semiconductor chip) is located on a substrate and coupled thereto.

BACKGROUND OF THE INVENTION

Packaging techniques for integrated circuits have developed with an emphasis on miniaturization. Improved methods enable integrating millions of transistor circuit elements into single integrated semiconductor embodied circuits or chips, and has resulted in more reliable, mass-producible packages. Forming an electronic package requires combining a plurality of circuits and integrated circuits and electrically connecting these circuits together. Once connected, other devices such as keyboards, video monitors and printers, may be connected and utilized together.

In order to establish this interconnection, conductive paths must be made available to connect the circuitry of the integrated semiconductor chip to external system electrical circuits. In one electronic package, for example in U.S. Pat. No. 5,808,873, by Celaya et al., an integrated semiconductor chip is positioned face up (die up) and secured with a quantity of adhesive to a conductive die mount pad on the surface of a substrate. The electronic package substrate includes a plurality of conductive pads, selected ones of which are electrically interconnected to a plurality of bond pads on the integrated semiconductor chip by, for example, wire bonding or other known techniques. The plurality of conductive pads in turn are connected to conductors and to electronic package pins or leads, extending from the package, that are used to connect to printed circuit boards or cards. Ball grid arrays (BGAS) can also be used for achieving a higher density of external package connections to be made as compared to packages having pins or leads extending therefrom.

In certain other electronic packages, a stiffener is joined to a substrate such as a printed circuit board or laminate circuit element, having a cavity in it for receiving an integrated semiconductor chip. In this type of package, the cavity extends completely through the substrate This type of structure can be referred to as a "cavity down" electronic package. For examples of cavity down packages see U.S. Pat. Nos. 5,798,909 and 5,724,232 both by Bhatt et al. Another type of "cavity" down electronic package can have a cavity formed in a substrate, for receiving an integrated semiconductor chip, wherein the cavity does not extend completely through the substrate. The integrated semiconductor chip is secured in the cavity by a quantity of adhesive to either the stiffener or a conductive die mount pad on the substrate. The substrates of the "cavity down" packages can also each include a plurality of conductive pads, selected ones of which are electrically interconnected to a plurality of bond pads on the respective integrated By semiconductor chips by, for example wire bonding or other known techniques.

These packages and methods of making them may exhibit a serious problem. In particular, the adhesive, either during lamination or curing, will have a tendency to bleed from under the integrated semiconductor chip. If not prevented, it may be possible for the adhesive to contact one or more of the nearby plurality of conductive pads, possibly adversely affecting the wirebondability of the conductive pads. The method of making these electronic packages is relatively difficult to control and some attempts to control the amount of bleed by in turn controlling the viscosity of the adhesive and the time and/or temperature of the lamination and cure have not been entirely successful.

The present invention is directed at overcoming the problem set forth above. It is desirable to have an electronic package and method to make the electronic package that will substantially prevent adhesive that bleeds from under an integrated semiconductor chip from contacting a plurality of conductive pads on the substrate. Electronic packages produced by this method will have increased yield, lower cost, and improved operational field life, since wire bonds made between wires and conductive pads will be made without the presence of adhesive on the conductive pads.

SUMMARY OF THE INVENTION

Accordingly, it is an object of this invention to enhance the art of packaging technology.

It is another object of this invention to provide a novel method for producing an electronic package that substantially prevents adhesive, that bleeds from under an integrated semiconductor chip, from contacting one or more of a plurality of conductive pads on the substrate of the electronic package.

It is yet another object of this invention to provide an electronic package that will be manufactured with increased yields and can be produced at relatively lower costs than many current products.

Still another object of this invention is to provide an electronic package made with wire bonds without the presence of adhesive on the conductive pads of the package that results in a package having much improved operational field life.

According to one aspect of this invention, there is provided an electronic package, comprising a substrate having a first surface and a first opening located therein, the first opening having at least one side wall and a bottom wall, the bottom wall including a second opening located therein having at least one side wall and a bottom wall, the bottom wall of the first opening further including a pedestal portion having an upper surface. A plurality of conductive pads located on the first surface of the substrate relative to the first opening is also provided. The electronic package further includes an electronic device positioned on the upper surface of the pedestal portion and secured to the upper surface by a quantity of adhesive, the electronic device being electrically coupled to selected ones of the plurality of conductive pads on the first surface of the substrate, the second opening substantially preventing the adhesive from contacting the plurality of conductive pads.

According to another aspect of this invention, there is provided an electronic package, comprising a substrate having a first surface and an opening located therein, the opening having at least one side wall and a bottom wall, the first surface of the substrate including a substantially planar first portion not having an electrical conductor or the like thereon and a second portion. The electronic package further includes a plurality of conductive pads located on the second portion of the first surface of the substrate relative to the opening. The electronic package also includes an electronic device positioned on the substantially planar first portion of the upper surface of the substrate and secured to the planar first portion by a quantity of adhesive, the electronic device electrically coupled to selected ones of the plurality of conductive pads on the second portion of the first surface of the substrate, the opening substantially preventing the adhesive from contacting the plurality of conductive pads.

According to yet another aspect of this invention, there is provided a method of making an electronic package comprising the steps of providing a substrate having a first surface and a first opening located therein, the first opening having at least one side wall and a bottom wall, the bottom wall including a pedestal portion having an upper surface, and forming a second opening in the bottom wall of the first opening, the second opening having at least one side wall and a bottom wall. The method also includes forming a plurality of conductive pads on the first surface of the substrate relative to the first opening and securing an electronic device to the upper surface by a quantity of adhesive. The method further includes electrically coupling the electronic device to selected ones of the plurality of conductive pads on the first surface of the substrate, the second opening substantially preventing the adhesive from contacting the plurality of conductive pads.

According to yet another aspect of this invention, there is provided a method of making an electronic package comprising the steps of providing a substrate having a first surface, forming an opening in the first surface, the opening having at least one side wall and a bottom wall, the first surface of the substrate including a substantially planar first portion not having an electrical conductor or the like thereon and a second portion, forming a plurality of conductive pads on the second portion of the first surface of the substrate relative to the opening, and securing an electronic device to the substantially planar first portion of the upper surface by a quantity of adhesive. The method further includes electrically coupling the electronic device to selected ones of the plurality of conductive pads on the second portion of the first surface of the substrate, the opening substantially preventing the adhesive from contacting the plurality of conductive pads.

According to another aspect of this invention, there is provided an electronic package, comprising a substrate having a first surface and a first opening located therein, the first opening having at least one side wall and a bottom wall, the bottom wall including a second opening located therein having at least one side wall and a bottom wall, the bottom wall of the first opening further including a pedestal portion having an upper surface. A plurality of conductive pads located on the first surface of the substrate relative to the first opening is also provided. The electronic package further includes an electronic device positioned on the upper surface of the pedestal portion and secured to the upper surface by a quantity of adhesive, the electronic device being electrically coupled to selected ones of the plurality of conductive pads on the first surface of the substrate, the second opening substantially preventing the adhesive from contacting the plurality of conductive pads. A quantity of encapsulant is positioned on the first surface of the substrate, the electronic device, and substantially within the first and second openings.

According to yet another aspect of this invention, there is provided an electronic package, comprising a substrate having a first surface and an opening located therein, the opening having at least one side wall and a bottom wall, the first surface of the substrate including a substantially planar first portion not having an electrical conductor or the like thereon and a second portion. The electronic package further includes a plurality of conductive pads located on the second portion of the first surface of the substrate relative to the opening. The electronic package also includes an electronic device positioned on the substantially planar first portion of the upper surface of the substrate and secured to the planar first portion by a quantity of adhesive, the electronic device electrically coupled to selected ones of the plurality of conductive pads on the second portion of the first surface of the substrate, the opening substantially preventing the adhesive from contacting the plurality of conductive pads. A quantity of encapsulant is positioned on the first surface of the substrate, the electronic device, and substantially within the opening.

The above objects, advantages, and features of the present invention will become more readily apparent from the following detailed description of the presently preferred embodiments as illustrated in the accompanying drawings.

BEST MODE FOR CARRYING OUT THE INVENTION

Figure 1:
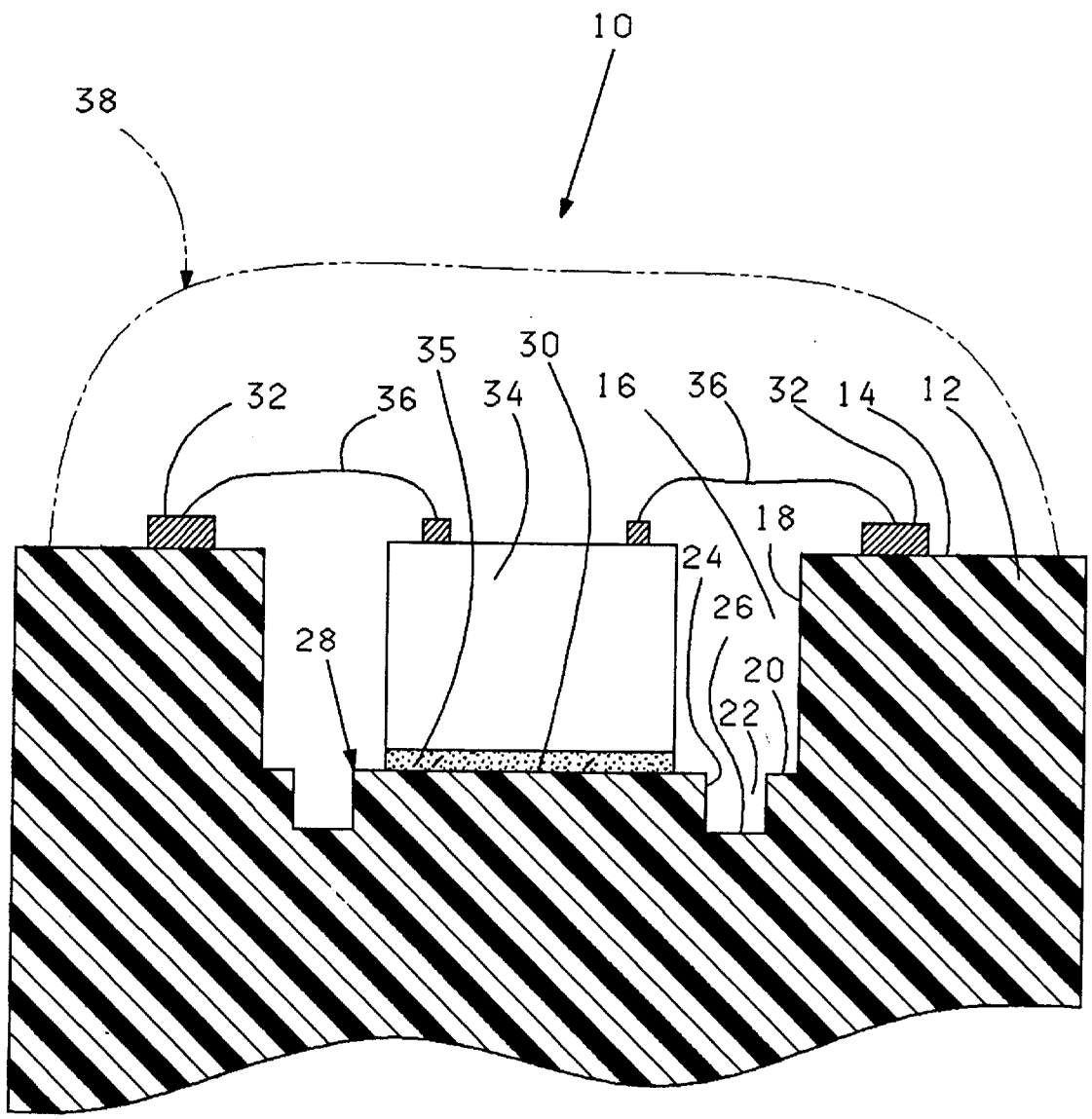
FIG. 1 is a sectional view in elevation of one embodiment of the electronic package of the present invention, illustrating an integrated semiconductor chip assembled to a substrate, the substrate having conductive pads, a first opening and a second opening in the bottom wall of the first opening.

An electronic package 10 embodying the present invention, is shown in FIG. 1. The electronic package 10 includes a substrate 12 with a first surface 14. The first surface 14 has a first opening 16 located therein, the first opening including at least one side wall 18 and a bottom wall 20. Bottom wall 20 includes a second opening 22 having at least one side wall 24 and a bottom wall 26. The bottom wall 20 of the first opening 16 further includes a pedestal portion 28 with an upper surface 30. Upper surface 30 of pedestal portion 28 is in substantially the same plane as bottom wall 20 of first opening 16. Substrate 12 may comprise a material selected from the group consisting of ceramics, epoxy resins, epoxy-filled resins, epoxy-reinforced resins, thermoplastics, filled thermoplastics, polyimides, and polyesters.

The electronic package 10 embodying the present invention of FIG. 1 includes a plurality of conductive pads 32 located on first surface 14 of substrate 12 relative to first opening 16. The conductive pads may comprise a metal, the metal selected from the group consisting of copper, aluminum, nickel, gold, and alloys thereof.

The electronic package embodying the present invention of FIG. 1 also includes an electronic device 34, preferably an integrated semiconductor chip, positioned on upper surface 30 of pedestal portion 28 and secured to the upper surface by a quantity of adhesive 35. The quantity of adhesive may be comprised of an epoxy resin adhesive. Examples of some adhesives that can be used in this invention are Ablestik 965-IL, Ablestik RP258-1, Ablestik 8510, available from Ablestik Corporation, Rancho Dominguez, Calif., Dexter CNB 709-20, available from Dexter Corporation, Windsor Locks, Conn., SUMI 1076-P, SUMI CRM 1531, available from Sumitomo Chemical America, Inc., New York, N.Y., Metech 6144, available from Metech Inc., Elversion, Pa., and Johnson Matthey 7100, available from Johnson Matthey Inc., West Deptford, N.J. All these adhesives can be cured at about 1 atmosphere of pressure.

Semiconductor chip 34 is electronically coupled to selected ones of the plurality of conductive pads 32 on first surface 14 of substrate 12 by a plurality of conductive wires 36. The plurality of conductive wires 36 may be comprised of a metal where the metal is selected from the group consisting of aluminum, gold, gold-beryllium, copper, palladium, and alloys thereof.

As previously discussed, adhesive 35 can have a tendency to bleed from under integrated semiconductor chip 34 during the lamination or curing steps used to secure the integrated semiconductor chip to upper surface 30 of pedestal portion 28. Bleeding may occur during the lamination step because the lamination step is performed under elevated temperature and pressure. Typically the lamination pressure which can be used is in the range of about 20 pounds per square inch or less and the lamination temperature which can be used is in the range of about 20 to about 100 degrees Centigrade. Elevating the temperature of the adhesive decreases the viscosity of the adhesive and increases its tendency to become more mobile. Increasing the pressure of a lower viscosity adhesive further adds to the mobility of the adhesive which can then bleed to one or more of the plurality of conductive pads 32 on substrate 12. Curing adhesive 35, which is typically performed after lamination, also typically can be done at an elevated temperature. Curing of the adhesive can be performed for about 3 to about 120 minutes in the range of about 100 to about 200 degrees Centigrade. Curing at elevated temperatures also adds to the mobility of the adhesive. Importantly, in the electronic package 10, embodying the present invention, the second opening 22 in bottom wall 20 is located adjacent and substantially surrounds pedestal portion 28. During the adhesive lamination and/or curing steps, adhesive 35 can bleed into second opening 22. As such, this opening prevents adhesive 35 from contacting the plurality of conducive pads 32 on substrate 12. The size and shape of the second opening is dependent on the amount and location of adhesive bleed that occurs during lamination and curing of the adhesive 35. For example one electronic package exhibited adhesive bleed only in the corners adjacent semiconductor chip 34. As a result, second opening 22 was profiled only in these corners, which prevented bleed onto conductive pads 32.

A quantity of encapsulant 38 (shown in phantom) may be positioned on first surface 14 of substrate 12, on electronic device 34, and substantially within first and second openings, 16 and 22 respectively. An example of such an encapsulant is Hysol FP 4450, available from Hysol Semiconductor and Liquid Encapsulants, 15051 East Don Julian Road, Industry California.

Figure 2:
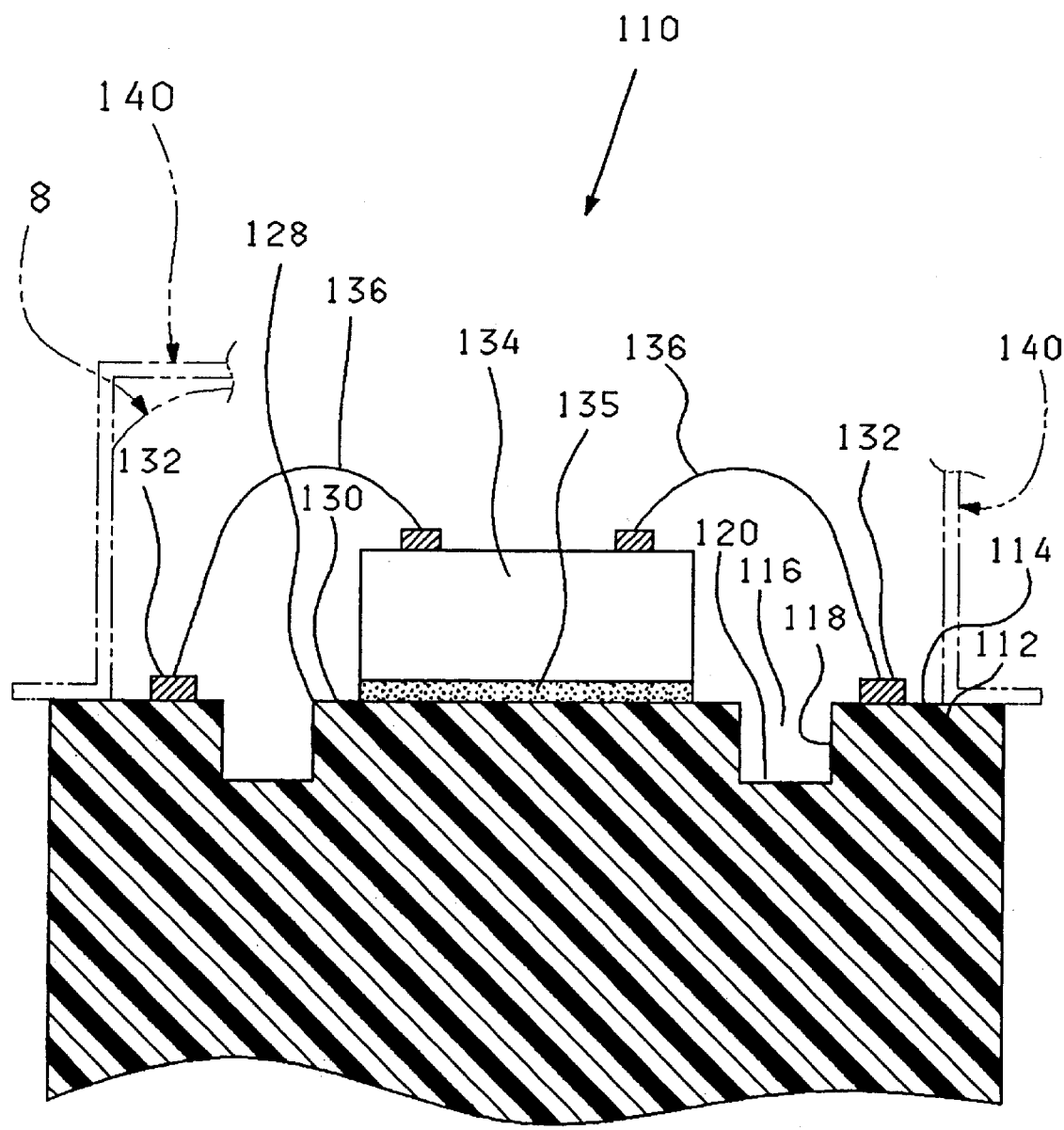
FIG. 2 is a sectional view in elevation of another embodiment of the electronic package of the present invention, illustrating an integrated semiconductor chip assembled to a substrate with a quantity of adhesive, the substrate having conductive pads and an opening in the substrate.

Another embodiment of the electronic package of the present invention, is shown in FIG. 2. Electronic package 110 includes a substrate 112 with a first surface 114. The first surface 114 includes an opening 116 located therein, the opening including at least one side wall 118 and a bottom wall 120. Typically, packages of this type include a die mount pad, preferably a conductive die mount pad, on the surface of the substrate on which an electronic device, such as an integrated semiconductor chip, is subsequently mounted and secured with an adhesive. First surface 114 of substrate 112 includes a first portion 128 having a planar upper surface 130, but has no conductive die mount pad and no conductor or the like thereon. Planar upper surface 130 of first portion 128 is in substantially the same plane as first surface 114 of substrate 112. Substrate 112 may comprise a material selected from the group consisting of ceramics, epoxy resins, epoxy-filled resins, epoxy-reinforced resins, thermoplastics, filled thermoplastics, polyimides, and polyesters.

Electronic package 110 embodying the present invention includes a plurality of conductive pads 132 located on first surface 114 of substrate 112 relative to opening 116. Conductive pads 132 may comprise a metal, the metal selected from the group consisting of copper, aluminum, nickel, gold, and alloys thereof.

The electronic package 110 embodying the present invention also includes electronic device 134, preferably an integrated semiconductor chip, positioned on planar upper surface 130 of first portion 128 and secured to the planar upper surface by a quantity of adhesive 135. The quantity of adhesive may be comprised of an epoxy adhesive, examples of which have been discussed above. Integrated semiconductor chip 134 is electrically coupled to selected ones of the plurality of conductor pads 132 on first surface 114 of substrate 112 by a plurality of conductive wires 136. The plurality of conductive wires 136 may be comprised of a metal where the metal is selected from the group consisting of aluminum, gold, gold-beryllium, copper, palladium, and alloys thereof.

Adhesive 135, like adhesive 35 in FIG. 1, can have a tendency to bleed from under integrated semiconductor chip 134, during the lamination and/or curing steps used to secure the integrated semiconductor chip to planar upper surface 130 of first portion 128. If so, it can contaminate one or more of the adjacent conductive pads 132. Importantly, in electronic package 110 embodying the present invention, opening 116 in substrate 112 is located adjacent and substantially surrounds first portion 128 and substantially prevents adhesive 135 from contacting the plurality of conductive pads 132 on substrate 112. A quantity of encapsulant 38 may be positioned on first surface 114 of substrate 112, on electronic device 134, and substantially within opening 116. A cover 140 (only partially shown in phantom) may also be positioned on encapsulant 38 to cover chip 134, wires 136, and pads 132.

Figure 3:
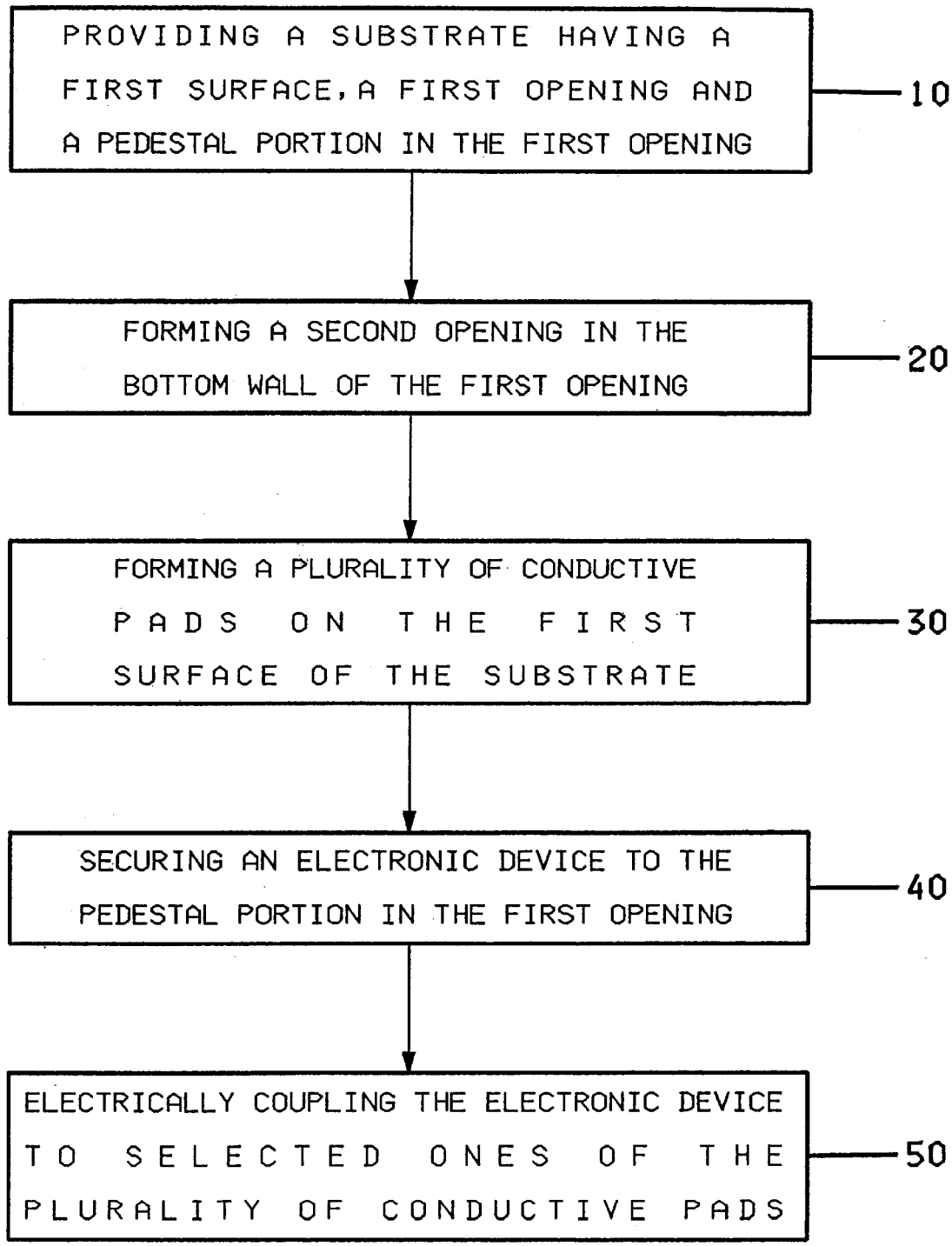
FIG. 3 is a flow diagram of the steps carried out in making an electronic package, in accordance with one embodiment of the present invention.

FIG. 3 illustrates the various steps involved in making an electronic package according to one aspect of the present invention. A substrate is provided, as depicted in Block 10, the substrate having a first surface and a first opening located therein, the first opening having at least one side wall and a bottom wall, the bottom wall including a pedestal portion having an upper surface. The first opening in the substrate, can be provided by a process of profiling, routing, drilling, gouging, scraping, digging, shaping, pressing, forging, extruding, trenching, molding, or framing. As depicted in Block 20, a second opening is then formed in the bottom wall of the first opening, the second opening having at least one side wall and a bottom wall. The second opening in the bottom wall can also be provided by a process of profiling, routing, drilling, gouging, scraping, digging, shaping, pressing, forging, extruding, trenching, molding, or framing. Block 30 describes the step of forming a plurality of conductive pads on the first surface of the substrate relative to the first opening. The plurality of conductive pads can be formed by subtractive or additive circuitization techniques well known by those skilled in the art of printed circuit board manufacturing.

Block 40 describes the step of securing an electronic device, preferably an integrated semiconductor chip, to the upper surface of the pedestal portion by a quantity of adhesive. After securing the electronic device, the quantity of adhesive is substantially cured by heating for about 3 to about 120 minutes at about 100 to about 200 degrees Centigrade.

Block 50 describes the electronic device as being electrically coupled, preferably by wirebonding, to selected ones of the plurality of conductive pads on the first surface of the substrate. As described above with respect to FIG. 1, the second opening substantially prevents the adhesive from contacting the plurality of conductive pads.

Figure 4:
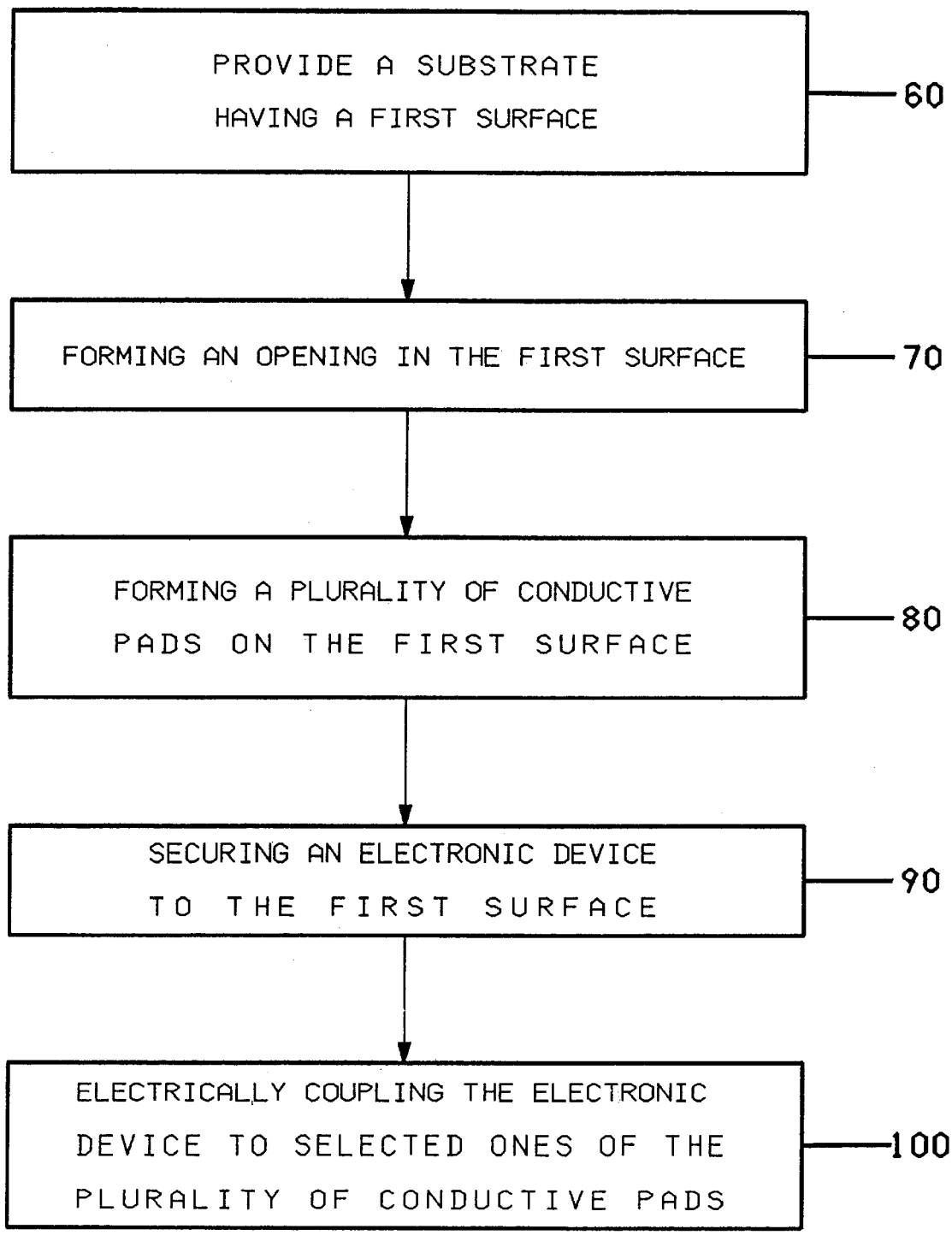
FIG. 4 is a flow diagram of the steps carried out in making an electronic package, in accordance with another embodiment of the present invention.

FIG. 4 illustrates the various steps involved in making an electronic package according to another aspect of the present invention. A substrate is provided, as depicted in Block 60, the substrate having a first surface. Block 70 depicts forming an opening in the first surface, the opening having at least one side wall and a bottom wall, the first surface of the substrate including a first portion thereon having a planar upper surface. As shown in FIG. 2, the planar upper surface has no conductive die mount pad thereon. The opening in substrate 110 can be provided by a process of profiling, routing, drilling, gouging, scraping, digging, shaping, pressing, forging, extruding, trenching, molding, or framing.

Block 80 describes the step of forming a plurality of conductive pads on the first surface of the substrate relative to the opening. The process for forming the plurality of conductive pads is similar to the process of forming the plurality of conductive pads as described in Step 30, FIG. 3.

Block 90 describes the step of securing an electronic device, preferably an integrated semiconductor chip, to the planar upper surface of the first portion by a quantity of adhesive. After securing the electronic device, the quantity of adhesive is substantially cured by heating for about 3 to about 120 minutes at about 100 to about 200 degrees Centigrade.

Block 100 describes the electronic device as being electrically coupled, preferably by wirebonding, to selected ones of the plurality of conductive pads on the surface of the substrate. As described with respect to FIG. 2, the opening substantially prevents the adhesive from contacting the plurality of conductive pads.

In summary, the defined package structures and methods of forming same provide an electronic package that is more reliable in operating field life and has lower defect levels in manufacturing, because adhesive is prevented from contacting the conductive pads. Wirebonds are formed between the metal wire and the metal without adhesive (a contaminate to wirebonding) being present on the conductive pads. This is uniquely accomplished by providing a substrate, upon which an electronic device is mounted and secured, having an opening that substantially prevents adhesive, which bleeds from under the electronic device during lamination or curing, from contacting the conductive pads. The product made with the unique teachings described herein, will have lower defect levels, increased yields, lower cost, and improved operational field life.

While there have been shown and described what are the present considered preferred embodiments of the invention, it will be obvious to those skilled in the art that various changes and modifications may be made therein without departing from the scope of the invention as defined by the appended claims.

We claim:

1. An electronic package comprising:

a substrate having a first surface and a first opening located therein, said first opening having at least one side wall and a bottom wall, said bottom wall including a second opening located therein having at least one side wall and a bottom wall, said bottom wall of said first opening further including a pedestal portion having an upper surface;

a plurality of conductive pads located on said first surface of said substrate relative to said first opening; and an electronic device positioned on said upper surface of said pedestal portion and secured to said upper surface by a quantity of adhesive, said electronic device electrically coupled to selected ones of said plurality of conductive pads on said first surface of said substrate, said second opening substantially preventing said adhesive from contacting said plurality of conductive pads.

2. The electronic package of claim 1 wherein said substrate is comprised of a material selected from the group consisting of ceramics, epoxy resins, epoxy-filled resins, epoxy-reinforced resins, thermoplastics, filled thermoplastics, polyimides, and polyesters.

3. The electronic package of claim 1 wherein said upper surface of said pedestal portion is in substantially the same plane as said bottom wall of said first opening.

4. The electronic package of claim 1 wherein said second opening is adjacent said pedestal portion.

5. The electronic package of claim 4 wherein said second opening substantially surrounds said pedestal portion.

6. The electronic package of claim 1 wherein said plurality of conductive pads on said first surface of said substrate are comprised of metal.

7. The electronic package of claim 6 wherein said metal is selected from the group consisting of copper, aluminum, nickel, gold, and alloys thereof.

8. The electronic package of claim 1 wherein said electronic device comprises a semiconductor chip.

9. The electronic package of claim 1 wherein said adhesive comprises an epoxy resin adhesive.

10. The electronic package of claim 1 further including a plurality of conductive wires, selected ones of said conductive wires electrically interconnecting said electronic device to selected ones of said plurality of conductive pads on said first surface of said substrate.

11. The electronic package of claim 10 wherein said plurality of conductive wires are comprised of metal.

12. The electronic package of claim 11 wherein said metal of said conductive wires is selected from the group consisting of aluminum, gold, gold-beryllium, copper, palladium, and alloys thereof.

13. An electronic package comprising:

a substrate having a first surface and an opening located therein, said opening having at least one side wall and a bottom wall, said first surface of said substrate including a substantially planar first portion not having an electrical conductor or the like thereon and a second portion;

a plurality of conductive pads located on said second portion of said first surface of said substrate relative to said opening; and an electronic device positioned on said substantially planar first portion of said upper surface of said substrate and secured to said planar first portion by a quantity of adhesive, said electronic device electrically coupled to selected ones of said plurality of conductive pads on said second portion of said first surface of said substrate, said opening substantially preventing said adhesive from contacting said plurality of conductive pads.

14. The electronic package of claim 13 wherein said substrate is comprised of a material selected from the group consisting of ceramics, epoxy resins, epoxy-filled resins, epoxy-reinforced resins, thermoplastics, filled thermoplastics, polyimides, and polyesters.

15. The electronic package of claim 13 wherein said opening is adjacent said first portion of said substrate.

16. The electronic package of claim 15 wherein said opening substantially surrounds said first portion of said substrate.

17. The electronic package of claim 13 wherein said planar upper surface of said first portion is in substantially the same plane as said first surface of said substrate.

18. The electronic package of claim 13 wherein said plurality of conductive pads on said first surface of said substrate are comprised of metal.

19. The electronic package of claim 18 wherein said metal is selected from the group consisting of copper, aluminum, nickel, gold, and alloys thereof.

20. The electronic package of claim 13 wherein said electronic device comprises a semiconductor chip.

21. The electronic package of claim 13 wherein said adhesive comprises an epoxy resin adhesive.

22. The electronic package of claim 13 further including a plurality of conductive wires, selected ones of said conductive wires electrically interconnecting said electronic device to selected ones of said plurality of conductive pads on said first surface of said substrate.

23. The electronic package of claim 22 wherein said plurality of conductive wires are comprised of metal.

24. The electronic package of claim 23 wherein said metal of said plurality of conductive wires is selected from the group consisting of aluminum, gold, gold-beryllium, copper, palladium, and alloys thereof.

25. A method of making an electronic package comprising the steps of:
   providing a substrate having a first surface and a first opening located therein, said first opening having at least one side wall and a bottom wall, said bottom wall including a pedestal portion having an upper surface;
   forming a second opening in said bottom wall of said first opening, said second opening having at least one side wall and a bottom wall;
   forming a plurality of conductive pads on said first surface of said substrate relative to said first opening;
   securing an electronic device to said upper surface of said pedestal portion by a quantity of adhesive; and
   electrically coupling said electronic device to selected ones of said plurality of conductive pads on said first surface of said substrate, said second opening substantially preventing said adhesive from contacting said plurality of conductive pads.

26. The method of making the electronic package of claim 25 wherein said first opening is provided in said substrate by profiling, routing, drilling, gouging, scraping, digging, shaping, pressing, forging, extruding, trenching, molding, or framing.

27. The method of making the electronic package of claim 25 wherein said second opening is provided in said bottom wall of said first opening by profiling, routing, drilling, gouging, scraping, digging, shaping, pressing, forging, extruding, trenching, molding, or framing.

28. The method of making the electronic package of claim 25 wherein said step of securing said electronic device to said upper surface by a quantity of adhesive further comprises the step of substantially curing said adhesive after securing said electronic device to said upper surface by said quantity of adhesive.

29. The method of making the electronic package of claim 28 wherein said substantially curing said adhesive comprises heating said quantity of adhesive for about 3 to about 120 minutes at about 100 to about 200° C.

30. The method of making the electronic package of claim 25 wherein said step of electrically coupling said electronic device to selected ones of said plurality of conductive pads on said first surface of said substrate comprises wirebonding.

31. A method of making an electronic package comprising the steps of:
   providing a substrate having a first surface;
   forming an opening in said first surface, said opening having at least one side wall and a bottom wall, said first surface of said substrate including a substantially planar first portion not having an electrical conductor or the like thereon and a second portion;
   forming a plurality of conductive pads on said second portion of said first surface of said substrate relative to said opening;
   securing an electronic device to said substantially planar first portion of said upper surface of said substrate by a quantity of adhesive; and
   electrically coupling said electronic device to selected ones of said plurality of conductive pads on said second portion of said first surface of said substrate, said opening substantially preventing said adhesive from contacting said plurality of conductive pads.

32. The method of making the electronic package of claim 31 wherein said opening in said first surface of said substrate is formed by profiling, routing, drilling, gouging, scraping, digging, shaping, pressing, forging, extruding, trenching, molding, or framing.

33. The method of making the electronic package of claim 31 wherein said step of securing said electronic device to said planar upper surface of said first portion by said quantity of said adhesive further comprises substantially curing said adhesive after securing said electronic device to said planar upper surface of said first portion by said quantify of adhesive.

34. The method of making the electronic package of claim 33 wherein said substantially curing said adhesive comprises heating said quantity of adhesive for about 3 to about 120 minutes at about 100 to about 200° C.

35. The method of making the electronic package of claim 31 wherein said step of electrically coupling said electronic device to selected ones of said plurality of conductive pads on said first surface of said substrate comprises wirebonding.

36. An electronic package comprising:
   a substrate having a first surface and a first opening located therein, said first opening having at least one side wall and a bottom wall, said bottom wall including a second opening located therein having at least one side wall and a bottom wall, said bottom wall of said a first opening further including a pedestal portion having an upper surface;
   a plurality of conductive pads located on said first surface of said substrate relative to said first opening;
   an electronic device positioned on said upper surface of said pedestal portion and secured to said upper surface by a quantity of adhesive, said electronic device electrically coupled to selected ones of said plurality of conductive pads on said first surface of said substrate, said second opening substantially preventing said adhesive from contacting said plurality of conductive pads; and a quantity of encapsulant positioned on said first surface of said substrate, said electronic device, and substantially within said first and second openings.

37. The electronic package of claim 36 wherein a cover is positioned on said encapsulant.

38. An electronic package comprising:

a substrate having a first surface and an opening located therein, said opening having at least one side wall and a bottom wall, said first surface of said substrate including a substantially planar first portion not having an electrical conductor or the like thereon and a second portion;

a plurality of conductive pads located on said second portion of said first surface of said substrate relative to said opening;

an electronic device positioned on said substantially planar first portion of said upper surface of said substrate and secured to said planar first portion by a quantity of adhesive, said electronic device electrically coupled to selected ones of said plurality of conductive pads on said second portion of said first surface of said substrate, said opening substantially preventing said adhesive from contacting said plurality of conductive pads; and a quantity of encapsulant positioned on said first surface of said substrate, said electronic devices and substantially within said opening.

39. The electronic package of claim 38 further including a cover positioned on said encapsulant.

* * * * *